United States Patent [19]
Mihashi

[11] Patent Number: 5,218,614
[45] Date of Patent: Jun. 8, 1993

[54] SEMICONDUCTOR LASER DEVICE
[75] Inventor: Yutaka Mihashi, Itami, Japan
[73] Assignee: Mitsubishi Denki Kabushiki Kaisha, Tokyo, Japan
[21] Appl. No.: 858,020
[22] Filed: Mar. 26, 1992

[30] Foreign Application Priority Data

Aug. 9, 1991 [JP] Japan .................. 3-224994

[51] Int. Cl.⁵ .............................................. H01S 3/19
[52] U.S. Cl. ............................................ 372/46; 372/45
[58] Field of Search ........................ 372/46, 45, 43

[56] References Cited

FOREIGN PATENT DOCUMENTS

| 60-136279 | 7/1985 | Japan . | |
|---|---|---|---|
| 61-214591 | 9/1986 | Japan . | |
| 2143483 | 6/1990 | Japan . | |
| 0268482 | 11/1990 | Japan | 372/46 |
| 0283085 | 11/1990 | Japan | 372/46 |
| 0012981 | 1/1991 | Japan | 372/46 |

OTHER PUBLICATIONS

Ishiguro et al, "Very Low Threshold Planar Buried Heterostructure InGaAsP/InP Laser Diode Prepared By Three-Stage Metalorganic Chemical Vapor Deposition", Applied Physics Letters, vol. 51, No. 12, 1987, pp. 874-876.

Primary Examiner—Georgia Y. Epps
Attorney, Agent, or Firm—Leydig, Voit & Mayer

[57] ABSTRACT

A semiconductor laser device has a thyristor current confinement structure at both sides of an active region. A p-n junction in the current confinement structure is forward biased during laser operation and is short-circuited by a metal layer or a low resistance material layer. Therefore, injection of holes from the p layer into the n layer of the short-circuited junction during laser operation is suppressed whereby the thyristor current confinement structure is not likely to be turned on. In addition, the current flowing through the blocking layer is decreased. As a result, current blocking is significantly improved, preventing a reduction in the laser output power and a reduction in the linearity of the light output versus current characteristic of the laser.

12 Claims, 5 Drawing Sheets

SEMICONDUCTOR LASER DEVICE

FIELD OF THE INVENTION

The present invention relates to a semiconductor laser device having a thyristor current confinement structure (a p-n-p-n structure) and, more particularly, to a semiconductor laser with an improved current blocking effect.

BACKGROUND OF THE INVENTION

FIG. 8 is a cross-sectional view showing a prior art semiconductor laser having a thyristor current confinement structure. In FIG. 8, reference numeral 1 designates an n type InP substrate. An n type InP cladding layer 2, an undoped InGaAsP active layer 3, and a first p type InP cladding layer 4 are successively disposed on the n type InP substrate 1. A ridge structure 15 includes a part of the substrate 1, the n type cladding layer 2, the active layer 3, and the first p type cladding layer 4. A p type InP current blocking layer 5 and an n type InP current blocking layer 6 are successively disposed on the substrate 1 at opposite sides of the ridge structure 15 so as to bury the ridge structure 15. A second p type InP cladding layer 7 is disposed on the n type InP current blocking layer 6 and the first p type cladding layer 4. A p type InGaAsP contact layer 8 is disposed on the second p type InP cladding layer 7. An n side electrode 9 is disposed on the rear surface of the substrate 1 and a p side electrode 10 is disposed on the p type InGaAsP contact layer 8. The second p type InP cladding layer 7, the n type InP current blocking layer 6, the p type InP current blocking layer 5, and the n type InP substrate 1 constitute a current confinement structure having a p-n-p-n structure, i.e., a thyristor structure.

This prior art semiconductor laser device operates as follows.

When a plus voltage and a minus voltage are applied to the p side electrode 10 and the n side electrode 9, respectively, i.e., a forward bias voltage is applied across the electrodes 10 and 9, a current flows from the p side electrode 10 through the contact layer 8 and the second p type cladding layer 7 toward the substrate 1 and is injected into the active layer 3, whereby laser oscillation occurs in the active layer 3. Since a p-n junction is formed on opposite sides of the active layer 3 by the current blocking layers 5 and 6, a reverse bias voltage is applied to this p-n junction during operation of the laser, so that the current is concentrated in the active layer 3. Since this laser device has a thyristor current confinement structure comprising the current blocking layers 5 and 6, the n type InP substrate 1 and the second p type InP cladding layer 7, leakage current flowing outside the active layer 3 is further reduced and more current is concentrated in the active layer 3.

However, even in the semiconductor laser device which has the thyristor current confinement structure at both sides of the active layer as shown in FIG. 8, the thyristor structure is sometimes turned on due to rising in ambient temperature, crystalline defects, rising temperature in the vicinity of the active layer during high power output operation, or the like. Further, an increase in the driving current sometimes causes a reduction in the current blocking effect, and it may increase the leakage current and cause a reduction in the laser output power, a reduction in the linearity of the light output vs. current characteristic or the like. Japanese Published Patent Application No. 61-214591 discloses a semiconductor laser device which further improves the current blocking effect. In this laser device, a base electrode is formed on a base region of a p-n-p transistor constituted by a p type cladding layer, an n type current blocking layer and a p type current blocking layer in a thyristor current confinement structure, and a reverse bias voltage is applied between emitter and base to reduce the injection current in the p-n-p transistor. In this structure, however, an external circuit is required for applying the reverse bias voltage between the emitter and base, resulting in a complicated laser driving circuit and a large-sized device.

SUMMARY OF THE INVENTION

It is an object of the present invention to provide a semiconductor laser device that prevents turn-on of a current confinement structure caused by rising ambient temperature, crystalline defects, rising temperature in the vicinity of an active layer during high power output operation or the like and that practically reduces a leakage current flowing through a blocking layer, thereby preventing a reduction in the output power of the semiconductor laser itself and a reduction in the linearity of the light output vs. current characteristic, without complicating the laser driving circuit.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In accordance with a semiconductor laser device of the present invention, at least a p-n junction in a p-n-p transistor in a thyristor current confinement structure, to which a forward bias voltage is applied during laser operation, is short-circuited by a metal electrode or a low resistance material layer. Thus, the electric potentials of a p layer and an n layer forming the p-n junction are close to each other, thereby suppressing the injection of holes from the p layer into the n layer, so that the thyristor current confinement structure is not likely to be turned on. Therefore, less of a current flowing into the thyristor structure is amplified and the leakage current flowing through blocking layers is suppressed.

DETAILED DESCRIPTION OF THE PREFERRED EMBODIMENTS

Embodiments of the present invention will be described in detail with reference to the drawings.

Figure 1:
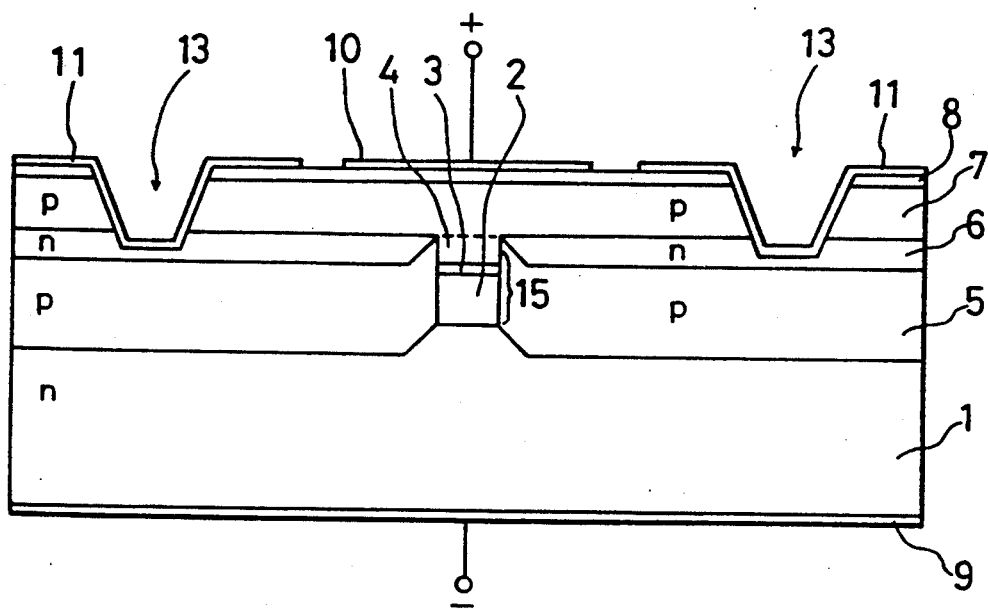
FIG. 1 is a cross-sectional view showing a semiconductor laser device in accordance with a first embodiment of the present invention.

FIG. 1 is a cross-sectional view showing a 1.3 to 1.55 microns wavelength band semiconductor laser device in accordance with a first embodiment of the present invention. In FIG. 1, the same references as those of FIG. 8 designate the same or corresponding parts. Reference numeral 1 designates an n type InP substrate. An n type InP cladding layer 2 having a thickness of 1 to 1.5 microns and a carrier concentration of $1 \times 10^{18}$ cm$^{-3}$ or less, an undoped In$_x$Ga$_{1-x}$As$_y$P$_{1-y}$ active layer 3 having a thickness of 0.05 to 0.15 micron (the composition ratios of x and y should be in ranges of x=0.255 to 0.410 and y=0.590 to 0.910 so as to enable lattice-matching with the n type InP substrate 1), and a first p type InP cladding layer 4 having a thickness of 0.5 to 1 micron and a carrier concentration of $1 \times 10^{18}$ cm$^{-3}$ or less are successively disposed on the n type InP substrate 1. A ridge structure 15 comprises a part of the n type InP substrate 1, the n type InP cladding layer 2, the undoped InGaAsP active layer 3 and the first p type InP cladding layer 4. A p type InP current blocking layer 5 having a thickness of 1 to 1.5 microns and a carrier concentration of $1 \times 10^{18}$ cm$^{-3}$ or less and an n type InP current blocking layer 6 having a thickness of 0.5 micron or less and a carrier concentration of $\sim 1 \times 10^{18}$ cm$^{-3}$ are successively disposed on the substrate 1 at opposite sides of the ridge structure 15 so as to bury the ridge structure 15. A second p type InP cladding layer 7 having a thickness of 0.5 to 1 micron and a carrier concentration of $1 \times 10^{18}$ cm$^{-3}$ or less is disposed on the n type InP current blocking layer 6 and the first p type InP cladding layer 4. A p type InGaAsP contact layer 8 having a thickness of 0.5 micron or less and a carrier concentration of $1 \times 10^{18}$ cm$^{-3}$ or less is disposed on the second p type InP cladding layer 7. An n side electrode 9 comprising Cr/Au is disposed on the rear surface of the n type InP substrate 1 and a p side electrode 10 comprising AuZn/Ti/Au is disposed on the p type InGaAsP contact layer 8. Stripe grooves 13 penetrate the p type InGaAsP contact layer 8 and the second p type InP cladding layer 7 and reach into the n type InP current blocking layer 6. Electrodes 11 for short-circuiting the p-n junction between the layers 6 and 7, comprising AuZn/Ti/Au, are disposed covering the surfaces of the stripe grooves 13 and extend to the p type InGaAsP contact layer 8. The n type InP substrate 1, the p type InP current blocking layer 5, the n type InP current blocking layer 6 and the second p type InP cladding layer 7 constitute a thyristor structure (p-n-p-n structure).

A method for manufacturing the semiconductor laser structure of FIG. 1 is illustrated in FIGS. 4(a) to 4(h).

Figure 4A:
FIGS. 4(a) to 4(h) are cross-sectional views of process steps for manufacturing the semiconductor laser device shown in FIG. 1.
Figure 4B:
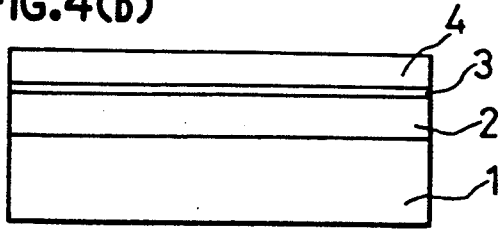
Figure 4C:
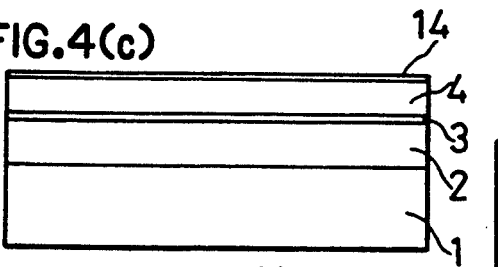
Figure 4G:
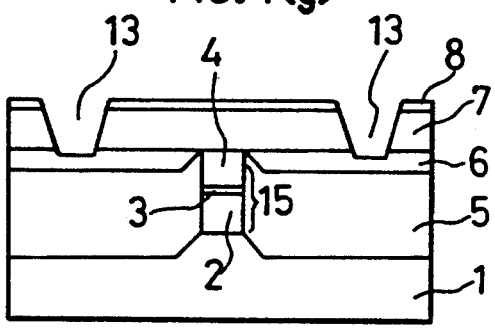
Figure 4D:
Figure 4E:
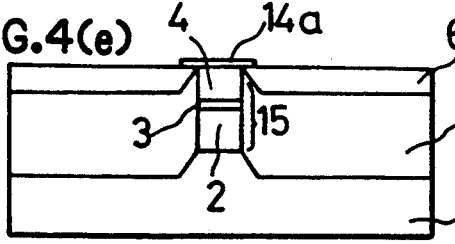
Figure 4H:
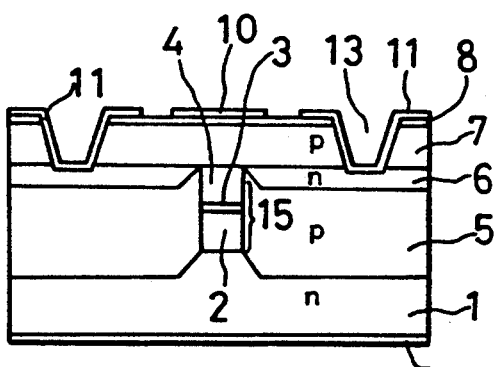
Figure 4F:
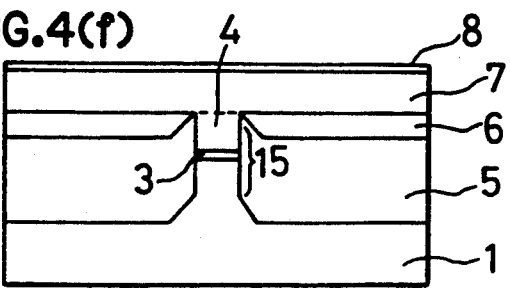

First, the n type InP substrate 1 shown in FIG. 4(a) is prepared. Then, as shown in FIG. 4(b), the n type InP cladding layer 2, the undoped InGaAsP active layer 3 and the first p type InP cladding layer 4 are successively grown on the substrate 1 by MOCVD (Metal Organic Chemical Vapor Deposition), LPE (Liquid Phase Epitaxy) or the like. Then, as shown in FIG. 4(c), an insulating film 14 comprising such as SiN$_4$ or SiO$_2$ is formed on the first p type InP cladding layer 4 by CVD (Chemical Vapor Deposition) or the like. Thereafter, the insulating film 14 is patterned in a stripe shape using an ordinary photolithography and etching technique. Then, using the strip-shaped insulating film 14a as a mask, the n type InP substrate 1, the n type InP cladding layer 2, the undoped IngaAsP active layer 3 and the first p type InP cladding layer 4 are partially etched away using a sulfate etchant, for example a solution comprising H$_2$SO$_4$ and H$_2$O$_2$ mixed in a ratio of 6:1, resulting in the ridge structure 15 shown in FIG. 4(d). Then, using the mask 14a as a mask for selective growth, the p type InP current blocking layer 5 and the n type InP current blocking layer 6 are successively grown on the substrate 1 by MOCVD, LPE or the like, as shown in FIG. 4(e). Then, as shown in FIG. 4(f), the mask 14a is removed and the second p type InP cladding layer 7 and the p type InGaAsP contact layer 8 are grown by MOCVD or the like. Then, as shown in FIG. 4(g), the n type InP current blocking layer 6, the second p type InP cladding layer 7 and the p type InGaAsP contact layer 8 are partially removed using an ordinary photolithography and etching technique to form the stripe grooves 13. Thereafter, a metal layer comprising AuZn/Ti/Au is formed on the p type InGaAsP contact layer 8 and the stripe grooves 13 by evaporation, sputtering or the like and patterned by etching with a mask, resulting in the p side electrode 10 and the p-n junction short-circuiting electrodes 11 shown in FIG. 4(h). Thus, the n type InP current blocking layer 6 is short-circuited to the second p type InP cladding layer 7 on the chip. Finally, the n side electrode 9 comprising Cr/Au is formed on the rear surface of the n type InP substrate 1 by evaporation, sputtering or the like, completing the laser structure. The p side electrode 10 and the p-n junction short-circuiting electrodes 11 may be formed by the lift-off method. In addition, the short-circuiting between the n type InP current blocking layer 6 and the second p type InP cladding layer 7 is equivalent to short-circuiting between p type emitter and n type base in the pnp transistor in the thyristor structure comprising the n type InP substrate 1, the p type InP current blocking layer 5, the n type InP current blocking layer 6 and the second p type InP cladding layer 7.

A description is given of the operation hereinafter.

When a plus voltage is applied to the electrode 10 while a minus voltage is applied to the electrode 9, i.e., a forward bias voltage is applied across the electrodes 9 and 10, a current flows from the contact layer 8 and the second cladding layer 7 toward the substrate 1 and is injected into the active layer 3, and laser oscillation occurs in the active layer 3.

Figure 5A:
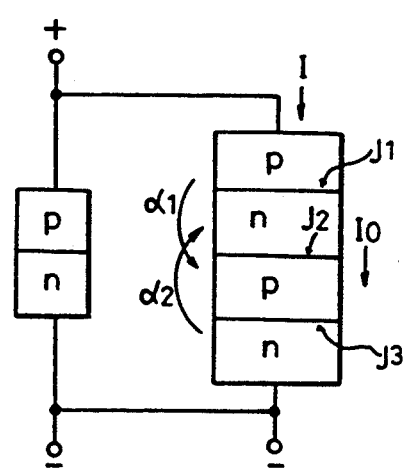
FIG. 5(a) is a schematic view showing a current confinement structure of the semiconductor laser device shown in FIG. 1
Figure 5B:
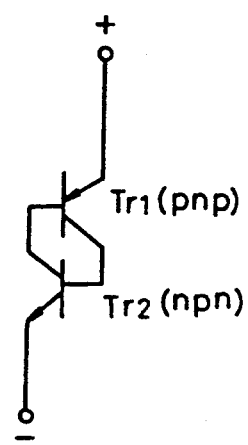
FIG. 5(b) is an equivalent circuit diagram thereof.

FIG. 5(a) is a schematic view showing the current confinement structure and FIG. 5(b) is an equivalent circuit diagram thereof. As shown in FIGS. 5(a) and 5(b), the current confinement structure comprising the n type InP substrate 1, the p type InP current blocking layer 5, the n type InP current blocking layer 6 and the second p type InP cladding layer 7 is regarded as a thyristor in which a pnp transistor Tr$_1$ and an n-p-n transistor Tr$_2$ are combined, and a current I, represented by the following equation (1), flows through the current confinement structure.

$$I = I_0 / \{1 - (\alpha_1 + \alpha_2)\} \quad (1)$$

Figure 6:
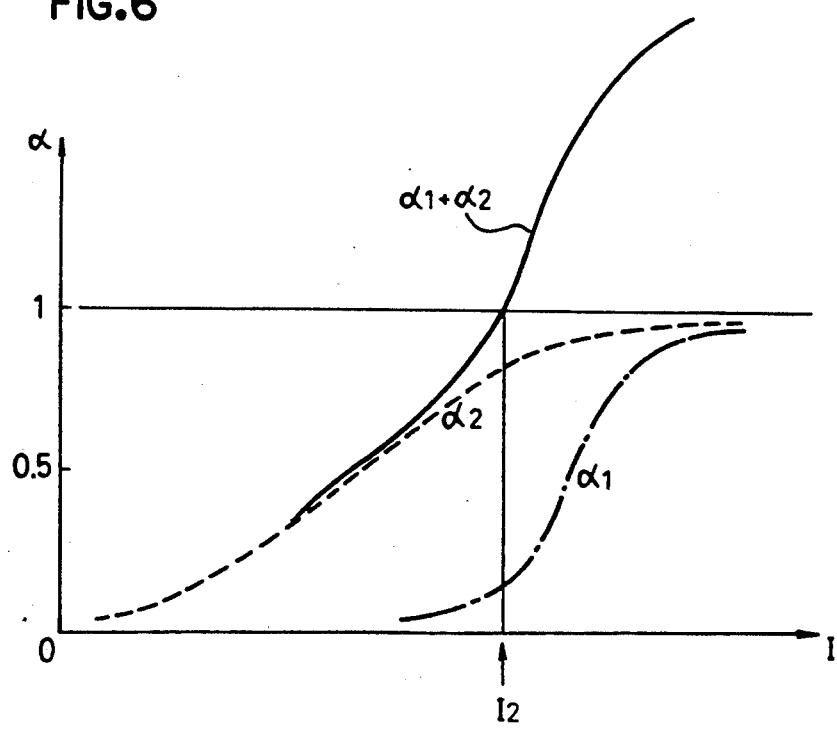
FIG. 6 is a graph showing leakage current dependences of common base current amplification factors of a p-n-p transistor and an n-p-n transistor in the current confinement structure of the semiconductor laser device shown in FIG. 1.
Figure 7:
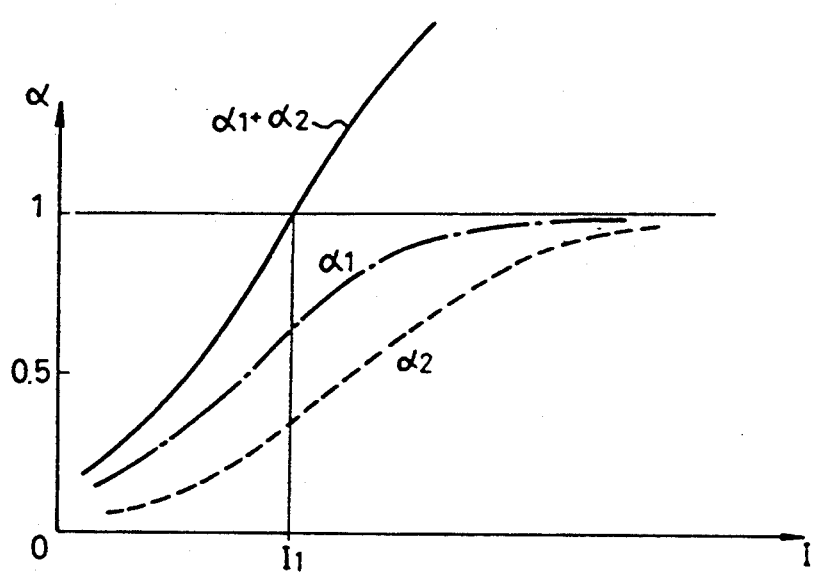
FIG. 7 is a graph showing leakage current dependences of common base current amplification factors of a p-n-p transistor and an n-p-n transistor in the current confinement structure of the prior art semiconductor laser device.
Figure 8:
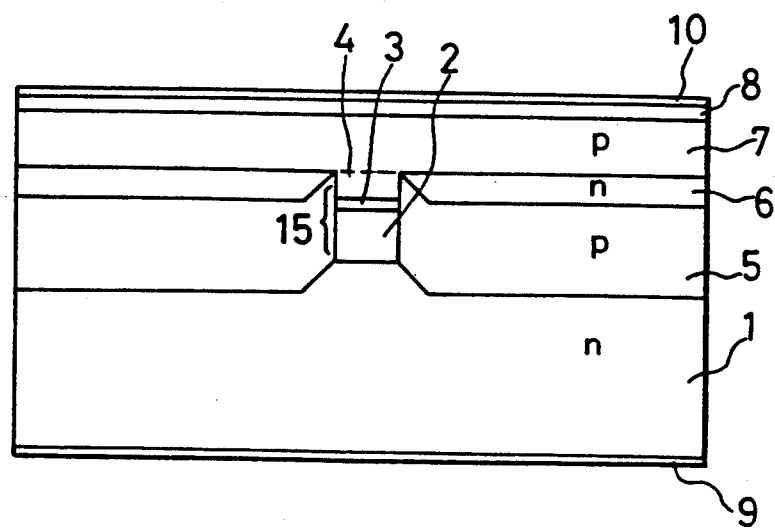
FIG. 8 is a cross-sectional view showing the prior art semiconductor laser device.

$\alpha_1$: common base current amplification factor of $Tr_1$ $\alpha_2$: common base current amplification factor of $Tr_2$ $I_0$: reverse bias leakage current of the central pn junction $J_2$ FIG. 6 is a graph showing the current (I) dependences of the common base current amplification factors $\alpha_1$ and $\alpha_2$ of the p-n-p transistor $Tr_1$ and the n-p-n transistor $Tr_2$, respectively, in the current confinement structure having the p-n-p-n structure of the semiconductor laser device according to the present invention and FIG. 7 is a graph showing those of the prior art semiconductor laser device shown in FIG. 8. In these graphs, when $\alpha_1 + \alpha_2 = 1$, the right side, i.e., the current I flowing into the current confinement structure, becomes infinite and then the thyristor is turned on. It is found from these graphs that the current dependence of the common base current amplification factor $\alpha_1$ of the p-n-p transistor $Tr_1$ according to the present invention shown in FIG. 6 is very small in a region where the current is small and rises considerably at a large current, as compared with that of the p-n-p transistor $Tr_1$ according to the prior art shown in FIG. 7. That is, the turn-on condition of the p-n-p-n thyristor of the semiconductor laser device according to the present invention, i.e., the current value $I_2$ at which $\alpha_1 + \alpha_2 = 1$, is very large as compared with the current value $I_1$ of the semiconductor laser device according to the prior art. Therefore, even when a relatively large current flows through the current confinement structure during laser operation, the thyristor structure is not turned on, so that the light output of the laser is not lowered and the laser oscillation is not stopped. In addition, in case where the reverse direction leakage current $I_0$ generated at the junction $J_2$ in the center of the thyristor structure (p-n-p-n structure) of the semiconductor laser device according to the present invention, to which junction a reverse bias boltage is applied during laser operation, is the same as that of the semiconductor laser device according to the prior art, less current flowing into the thyristor structure is amplified as is evident from the equation (1). In other words, the current flowing through the current confinement structure is much smaller than that of the prior art device.

According to the semiconductor laser device of the present invention, the ridge structure 15 is formed of a part of the n type InP substrate 1, the n type InP cladding layer 2, the undoped InGaAsP active layer 3 and the first p type InP cladding layer 4, and the thyristor current confinement structure comprising the n type InP substrate 1, the p type InP current blocking layer 5, the n type InP current blocking layer 6 and the second p type InP cladding layer 7 is formed at both sides of the ridge structure 15 including the active layer 3. Further, the n type InP current blocking layer 6, the second p type InP cladding layer 7 and the p type InGaAsP contact layer 8 are partially removed to form stripe grooves 13 and the p-n junction short-circuiting electrodes 11 are formed in the stripe grooves 13 thereby to short-circuit the n type InP current blocking layer 6 with the second p type InP cladding layer 7. Therefore, injection of holes from the p type InP cladding layer 7 into the n type InP current blocking layer 6 is suppressed without providing an extra electrode for applying reverse bias voltage or an external circuit, so that the thyristor current confinement structure is not likely to be turned on. Further, less current flowing into this thyristor structure is amplified and the absolute value of the leakage current is reduced. As the result, the thyristor is not turned on by rising ambient temperature, crystalline defects, rising temperature in the vicinity of the active layer during high power output operation or the like, and the leakage current flowing into the current confinement structure (blocking layers 5 and 6) is reduced, so that a reduction in the output power of the semiconductor laser itself and a reduction in the linearity of the light output vs. current characteristic is suppressed.

Figure 2:
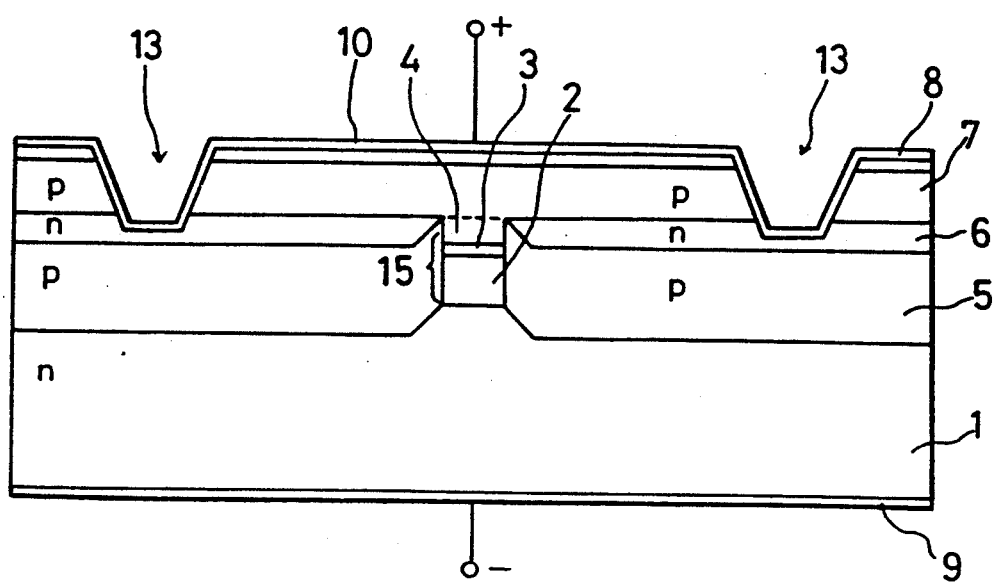
FIG. 2 is a cross-sectional view showing a semiconductor laser device in accordance with a second embodiment of the present invention.

FIG. 2 is a cross-sectional view showing a semiconductor laser device in accordance with a second embodiment of the present invention. In FIG. 2, the same references as those in FIG. 1 designate the same or corresponding parts. In this second embodiment, the p side electrode 10 comprising AuZn/Ti/Au serves as the p-n junction short-circuiting electrode. Manufacturing steps of this laser device are essentially identical to those shown in FIGS. 4(a) to 4(h). Since it is not necessary to form the p-n junction short-circuiting electrodes 11 in the final step of forming the electrodes, this step can be simplified. In addition, when crystalline defects are formed in the vicinity of interface between the ridge structure 15 and the p type InP cladding layer 7 or the n type InP current blocking layer 6, the current flowing from the p side electrode 10 into the active layer 3 (ridge structure 15) may leak from these layers 7 and 6. Therefore, it is necessary to separate the stripe grooves 13 from the ridge part 15 by approximately 5 microns or more.

Figure 3:
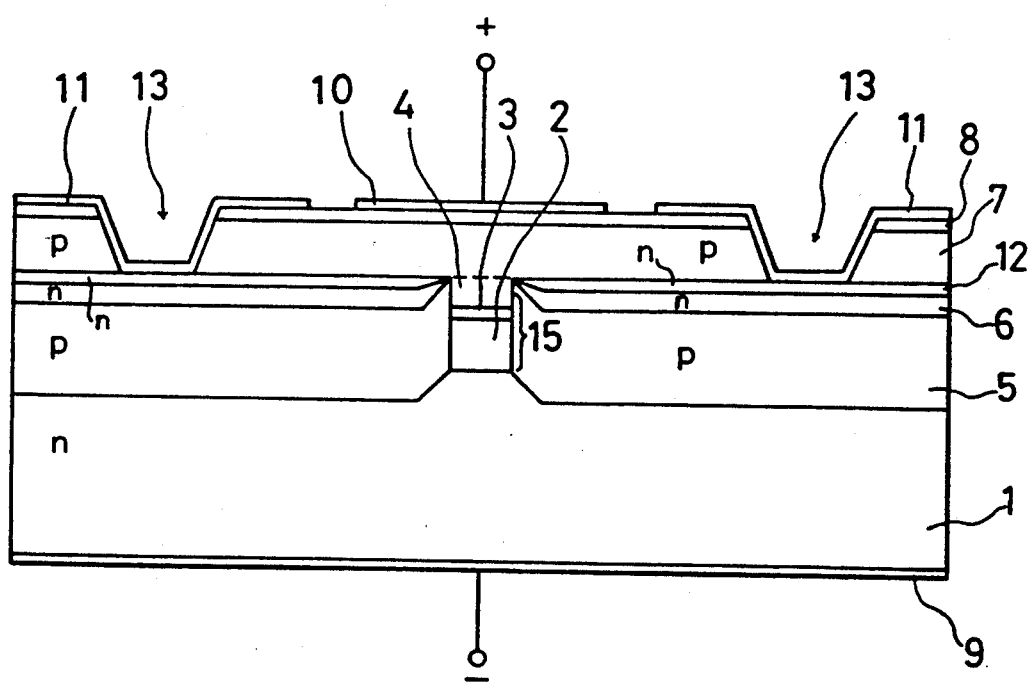
FIG. 3 is a cross-sectional view showing a semiconductor laser device in accordance with a third embodiment of the present invention.

FIG. 3 is a cross-sectional view showing a semiconductor laser device in accordance with a third embodiment of the present invention. In FIG. 3, the same references as those in FIG. 1 designate the same or corresponding parts. In this third embodiment, the n type current blocking layer has a double-layer structure including an n type InP blocking layer 6 and an n type InGaAsP blocking layer 12. Therefore, when the stripe grooves 13 are formed by selective etching using, for example HCl ans an etchant, the n type InGaAsP blocking layer 12 serves as an etch stopping layer and the grooves 13 reliably reach the blocking layer 12. Thus, the p type InP cladding layer 7 and the n type InGaAsP blocking layer 12 are short-circuited with each other reliably by the p-n junction short-circuiting electrodes 11 formed in the stripe grooves 13, resulting in a semiconductor laser device with high stability and high reliability. In addition, fewer faulty devices are produced, resulting in an improved production yield.

While in the above-described first to third embodiments the p-n junction short-circuiting electrode 11 is formed of metal, it may be formed of a low resistance material such as polysilicon. Also in this case, the same effects as described above can be obtained.

In the semiconductor laser devices according to the first and third embodiments, the current confinement structure is formed by successively growing crystalline layers on the n type substrate in the order of n-p-n-p at both sides of the ridge structure comprising an n type substrate, an n type cladding layer, and an undoped active layer. However, the current confinement structure may be formed by successively growing crystal layers on a p type substrate in the order of p-n-p-n at both sides of the ridge structure comprising a p type substrate, a p type cladding layer, and an undoped active layer. Also in this case, the same effects as described above are obtained.

According to the present invention, a semiconductor laser device included a thyristor current confinement structure.

A p-n junction in the current confinement structure, to which a forward bias voltage is applied during laser operation, is short circuited by a metal electrode or a low resistance material layer. Therefore, injection of holes from the p layer into the n layer, which are short-circuited during the laser operation, is suppressed, so that the current confinement structure is not likely to be turned on. In addition, the current practically flowing through the blocking layer is decreased. As the result, a current blocking is significantly improved, preventing a reduction in the laser output power and a reduction in the linearity of the light output vs. current characteristic.

What is claimed is:

1. A semiconductor laser device having an active region and thyristor current confinement structure disposed on opposite sides of said active region, said thyristor including a p-n junction to which a forward bias voltage is applied during laser operation and an electrically conductive layer short-circuiting said p-n junction.

2. The semiconductor laser device in accordance with claim 1 wherein said active region comprises a ridge structure including an n type substrate, and an n type cladding layer and an undoped active layer successively disposed on said n type substrate, said current confinement structure burying said ridge structure.

3. The semiconductor laser device in accordance with claim 2 wherein said current confinement structure comprises an n type InP substrate, a p type InP current blocking layer, an n type InP current blocking layer, and a p type InP cladding layer.

4. The semiconductor laser device in accordance with claim 3 wherein a p-n junction between said n type InP current blocking layer and said p type InP cladding layer is short-circuited by said electrically conductive layer.

5. The semiconductor laser device in accordance with claim 4 including an n type InGaAsP current blocking layer disposed between said n type InP current blocking layer and said p type InP cladding layer and wherein the p-n junction formed by said n type InGaAsP current blocking layer and said p type InP cladding layer is short-circuited by said electrically conductive layer.

6. The semiconductor laser device in accordance with claim 1 wherein said electrically conductive layer short-circuiting the p-n junction comprises layers of an AuZn alloy, Ti, and Au.

7. The semiconductor laser device in accordance with claim 1 wherein said electrically conductive layer short-circuiting the p-n junction comprises polysilicon.

8. The semiconductor laser device in accordance with claim 1 wherein said electrically conductive layer short-circuiting the p-n junction is an electrode of said laser device.

9. The semiconductor laser device in accordance with claim 1 wherein said electrically conductive layer short-circuiting the p-n junction is the same material as an electrode of said laser device.

10. A semiconductor laser comprising:
a first conductivity type substrate;
an active region disposed on the substrate including, successively disposed, a first conductivity type first cladding layer, an active layer, and a second conductivity type second cladding layer;
a second conductivity type contacting layer disposed on the second cladding layer;
a current confinement structure disposed between and contacting the substrate and the contacting layer and disposed on opposite sides of and contacting the active region comprising, successively disposed on the substrate, a second conductivity type layer and a first conductivity type layer, whereby the substrate, current confinement structure, and contacting layer form a thyristor structure;
at least one groove spaced from the active region penetrating through the contacting layer and reaching the first conductivity type layer of the current confinement structure;
an electrically conducting material disposed in the groove, short-circuiting the junction between the contacting layer and the first conductivity type layer of the current confinement structure; and
a first electrode electrically contacting the substrate and a second electrode electrically contacting the contacting layer.

11. The semiconductor laser in accordance with claim 10 wherein the second electrode and the electrically conducting material disposed in the groove are a unitary layer of the same material.

12. The semiconductor laser in accordance with claim 10 including a plurality of grooves penetrating through the contacting layer and reaching the first conductivity type layer of the current confinement structure, spaced from the active region and containing an electrically conductive material short-circuiting the junction between the contacting layer and the first conductivity type layer of the current confinement structure.

* * * * *